United States Patent
Tran et al.

(10) Patent No.: US 6,252,814 B1
(45) Date of Patent: Jun. 26, 2001

(54) DUMMY WORDLINE CIRCUITRY

(75) Inventors: Tam Minh Tran; Scott A. Taylor, both of Austin, TX (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/303,347

(22) Filed: Apr. 29, 1999

(51) Int. Cl.[7] ........................................ G11C 7/02
(52) U.S. Cl. ............................................... 365/210
(58) Field of Search ............... 365/210, 230.06, 365/233, 185.2

(56) References Cited

U.S. PATENT DOCUMENTS

| | | | |
|---|---|---|---|
| 4,622,655 | * 11/1986 | Suzuki | 365/210 |
| 4,907,200 | * 3/1990 | Ikawa et al. | 365/210 |
| 5,062,079 | * 10/1991 | Tsuchida et al. | 365/210 |
| 5,485,427 | * 1/1996 | Ogawa | 365/210 |
| 5,596,543 | * 1/1997 | Sakui et al. | 365/230.06 |
| 5,657,269 | * 8/1997 | Nanamiya | 365/185.2 |
| 5,724,294 | * 3/1998 | Khieu | 365/210 |

* cited by examiner

*Primary Examiner*—Trong Phan
(74) *Attorney, Agent, or Firm*—Kelly K. Kordzik; Winstead Sechrest & Minick P.C.; Anthony V. S. England

(57) ABSTRACT

Two separate dummy wordlines, a read dummy wordline and a write dummy wordline, are implemented within a memory array to provide for higher frequency operation of read and write cycles within the memory array. The two dummy wordlines are utilized to activate and deactivate the wordline enable signal for the read and write portions of an access. Such an access can be a read/swap cycle.

14 Claims, 7 Drawing Sheets

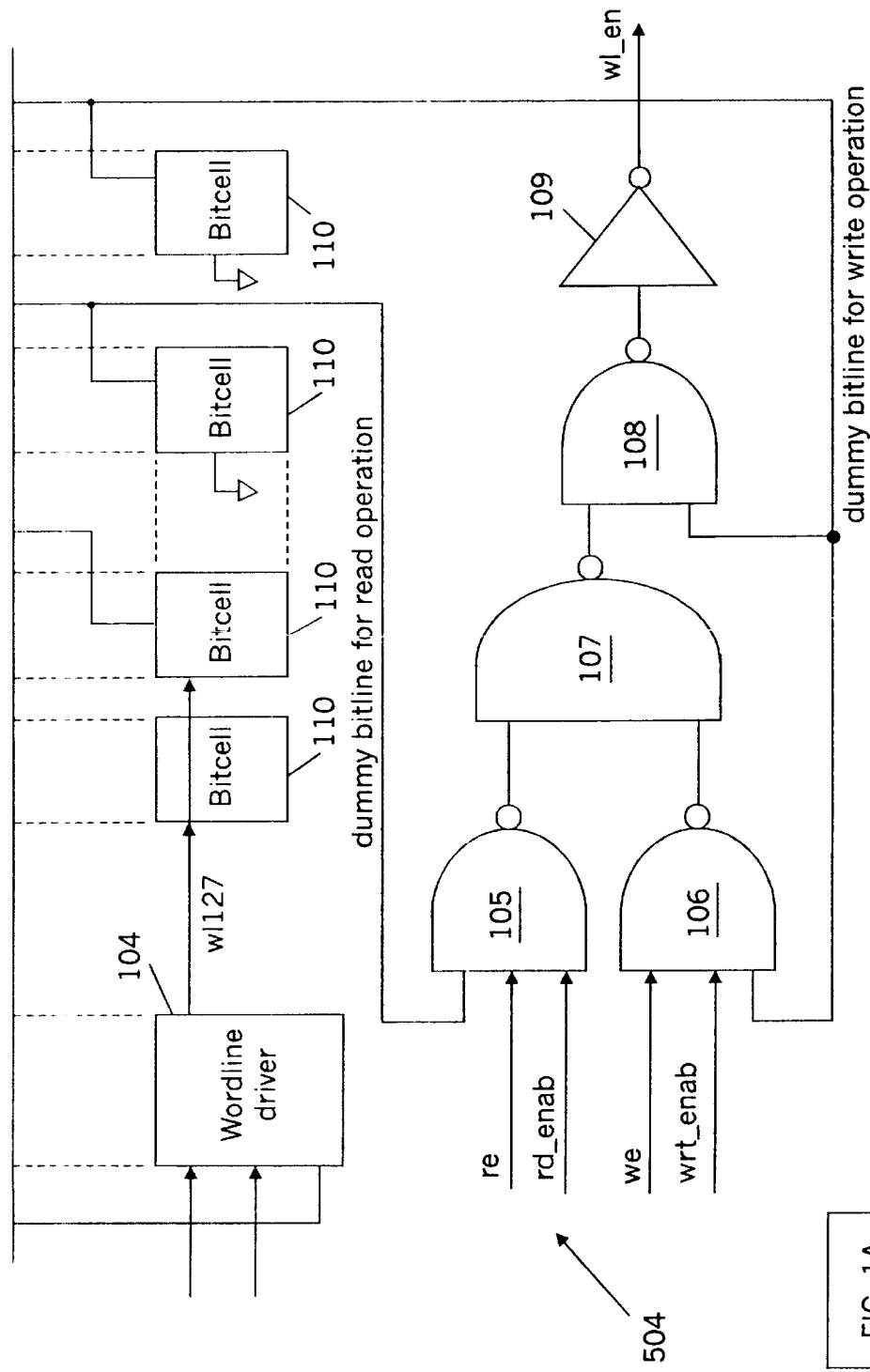
FIG. 1B
FIG. 1
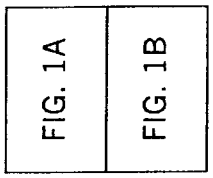

Read - Reload
Swap Cycle-
Synchronous
Operation

Read - Reload Swap Cycle-Asynchronous Operation

DUMMY WORDLINE CIRCUITRY

TECHNICAL FIELD

The present invention relates in general to memory cells for use in storage systems and information handling systems, and more particularly, to a memory cell having dummy wordline circuitry.

BACKGROUND INFORMATION

One of the goals in designing microelectronics circuitry, especially circuitry pertaining to the retrieval and storage of information in memory cells, is an increase in the speed of memory accesses. Often, the performance of a data processing system is mostly dependent upon the speed of memory accesses, because microprocessor frequencies are far more advanced.

Such memory systems often use static random access memories ("SRAM"). Dual rail SRAM cells are well-known in the prior art. FIG. 7 illustrates a prior art SRAM cell 700 having a standard design. Each SRAM cell 700 requires a bitline 713 and its complement 712. Cell 700 operates differentially between bitline 713 and complement 712. Precharge transistor 720 precharges bitline 713, and precharge transistor 708 precharges complement bitline 712. Control transistor 716 gates data from complement line 712 to the latch formed of cross-coupled inverter 724 and 726. Transistor 716 and 730 are coupled to dual rail wordlines. Transistor 714 is a write enable control transistor. Transistor 710 is a write enable control for complement bitline 712. The outputs of cells 700 are connected to a sense amplifier (not shown) for transmission of the data at standard levels out of the storage array (not shown) for use by the information handling system.

Conventional tag and cache memory arrays usually have only one dummy wordline to track the duration of the wordline turning on during a read operation. This dummy wordline can also be used to disable the wordline after enough differential voltage has developed at the sense nodes. At the same time, the dummy wordline may be used to generate the isolation signal to isolate the bitlines from the sense node, and to enable the sense amplifier signal for sensing. All of the above takes place during a read cycle.

Dummy wordlines are utilized, because they track the timing through the memory array better than a plurality of invertors used to simulate the delay of the wordline signal through the memory array.

A typical access to such tag and cache arrays involves a read/reload-swap cycle, whereby data is read from the memory cells during a read cycle and then replaced during the reload-swap portion of the cycle, which is essentially a write operation. The write/reload-swap takes place in the second half of the cycle after the read portion, and a wordline is needed to fire off again when the write clock arrives. To enable the wordline again in the second half of the cycle, the dummy wordline would be needed to precharge again after it disables the wordline in the read cycle. This precharged action, in turn, will precharge the isolation and sense amp signals. In the write cycle, or reload-swap, the isolation signal continues to be active to disconnect the bitlines and the sense node so that no write through occurs. This implies that the isolation and sense amp circuits need to be dynamic and therefore the logic and timing would be more complicated and could potentially cause the memory array to run slower. As a result, there is a need in the art for an additional dummy wordline circuit to fire off during the write/reload-swap operation and reset the tag or cache array to an initial state for the next read operation.

Essentially, with one dummy wordline, at a high frequency operation, there is insufficient time to precharge the single dummy wordline for the next cycle. With such read/write processes occurring in the same cycle, the prior art has alternatively tried to keep the single wordline at an asserted state, but this consumes too much power.

Therefore, there is a need in the art for a dummy wordline circuit that can operate at higher frequencies.

SUMMARY OF THE INVENTION

The present invention addresses the foregoing need by implementing two dummy wordlines within a memory array. One of the dummy wordlines is used for the read portion of the access cycle, while the second dummy wordline is used for the write portion of the access cycle.

At the beginning of the read/swap cycle, all wordlines, bitlines, dummy wordlines, and dummy bitlines are precharged to appropriate voltages. At the rising edge of the beginning of the read cycle, a wordline enable signal is activated to enable the read dummy wordline and the wordline. A time delay later, the read dummy wordline signal discharges the dummy bitline read signal, which then disables the wordlines, and the read dummy bitline triggers the isolation and sense amp signals.

In the second half of the read/swap cycle, the write signal is active (clock signal is negated). This causes the write enable signal to again become active. When the wordline enable signal is active, it activates the second dummy wordline write signal which in turn pulls down the write dummy bitline signal.

When the write dummy bitline signal goes active (low), it pulls the write enable signal down to terminate the write (since the write process is completed by that time). It also enables a bitline equalization signal again to precharge the bitlines for the next read cycle. It additionally triggers the isolation signal to allow the bitlines connecting to the sense amp for precharging of the sense nodes. It further kills the sense amp signals and kills the wordline enable and precharges all the wordlines again to a low state.

One advantage of the present invention is that it provides for better wordline tracking to ensure the write portion of the cycle is completed before the wordline is turned off. Another advantage of the present invention is that it improves the maximum operating frequency of the memory array. Yet another advantage of the present invention is that the memory array can operate in an asynchronous mode for the write portion of the cycle, meaning that the write can take place as soon as the read finishes without waiting for the falling edge of the clock. And yet still another advantage of the present invention is that all the logic for generating isolation and sensing signals does not have to be dynamic, therefore it can eliminate a lot of the problems associated with timing for dynamic circuitry.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
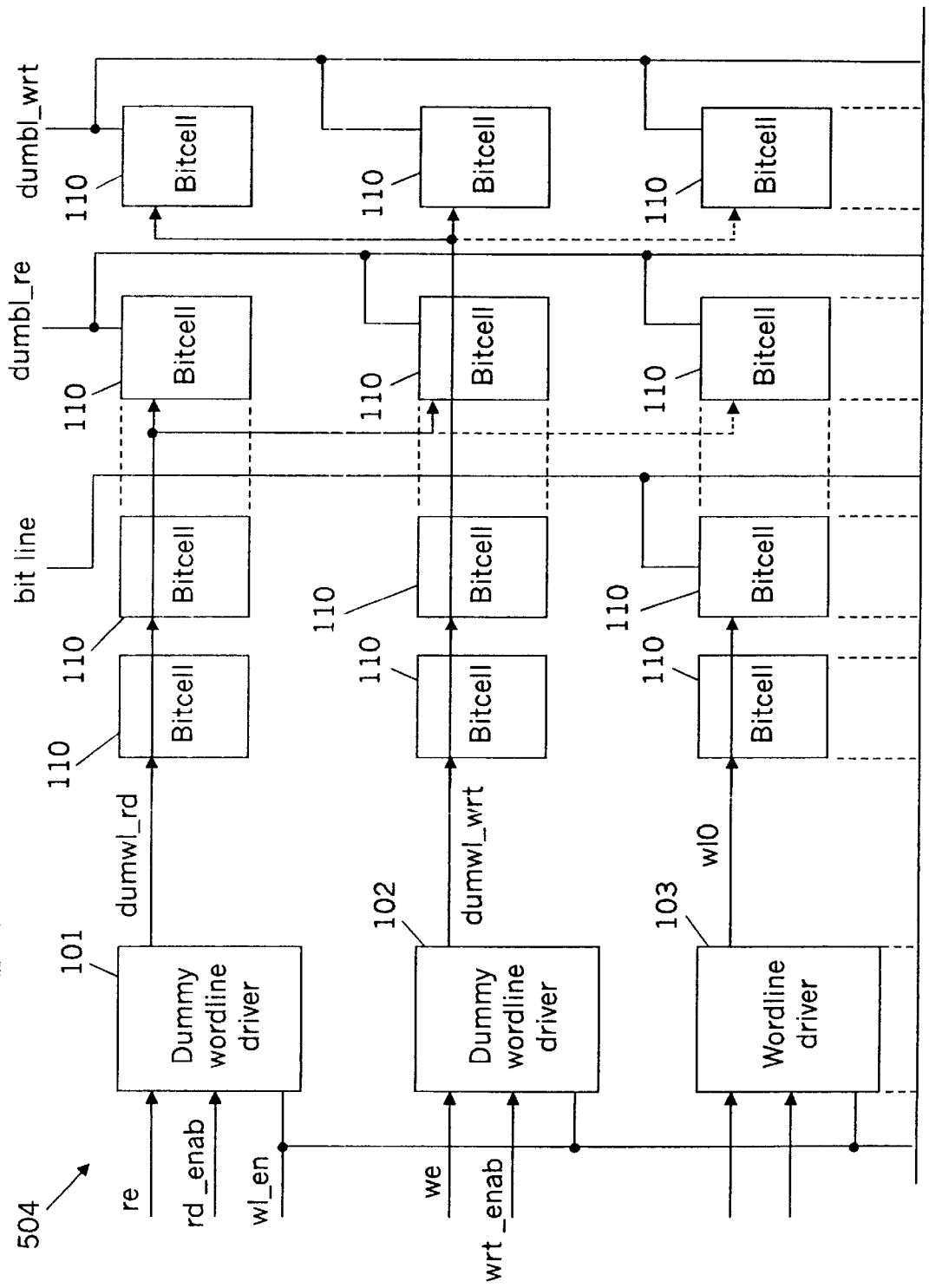
FIG. 1 illustrates a memory array implementing two dummy wordlines.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

A noted advantage of the present invention is that it provides for better wordline tracking to ensure the write is finished before the wordline is turned off. In traditional implementations, an inverter delay chain (as described above in the Background) is timed off the rising edge of the write clock to track the wordline in the write portion of the cycle. This inverter chain never tracks well with the wordlines over a range of processed corners, and this could result in a memory cell not being written to correctly.

Another previously mentioned advantage is that the maximum operating frequency of the memory array is increased. The duration of the wordline pulse (high) in the write portion of the cycle does not have to be as wide as the duration of the wordline in the read portion of the cycle, since the write operation usually finishes faster than the read operation. For the read, the wordline needs to be on longer to ensure enough differential voltage developing between the bitlines. Since the write wordline can shut down early, the memory array can be precharged earlier to prepare for the next active cycle. Thus, when operated at higher frequencies, the memory array is not limited by the precharge time at the end of the cycle.

Yet another advantage of the present invention mentioned previously is that the memory array can be operated in an asynchronous mode, which would allow the memory array to operate at a higher frequency. Since the write operation depends on the second dummy wordline, it does not need to wait for the falling clock edge to start the write portion of the cycle. As soon as the read portion is finished, the write portion can take place immediately as long as the write enable signal and data to be written are ready at the end of the read operation.

Referring to FIG. 1, there is illustrated a portion of a memory array 504 having a plurality of memory cells, bitcells 110, which are arranged in a typical matrix-addressable manner whereby the use of wordlines and bitlines provide for the reading and writing of data to/from the individual bitcells 110. As noted previously, array 504 may be any type of memory array used within a data processing system, such as data processing system 613 illustrated in further detail below with respect to FIG. 6 (though not limited to the specific structure illustrated in FIG. 6), including tag and cache arrays along with other types of storage arrays.

There are a plurality of wordline driver circuits 101–104 for accessing rows of the array 504. Wordline driver circuit 103 accesses a plurality of bitcells 110 within its respective row using wordline w10, while wordline driver circuit 104 accesses a plurality of bitcells 110 within its respective row using wordline w1127. However, the present invention is not to be limited to an array having 128 rows of bitcells.

Dummy wordline driver circuit 101 uses dummy wordline dumwl_rd to access a plurality of dummy bitcells 110 within its respective row, while a second dummy wordline driver 102 produces dummy wordline signal dumwl_wrt, which passes through dummy bitcells 110 within its respective row. The bitcells 110 accessed by the two dummy wordlines dumwl_rd and dumwl_wrt do not store actual data for access by external circuitry, but are implemented to provide the proper amount of gate delay for the dummy wordline signals to pass through.

Figure 7:
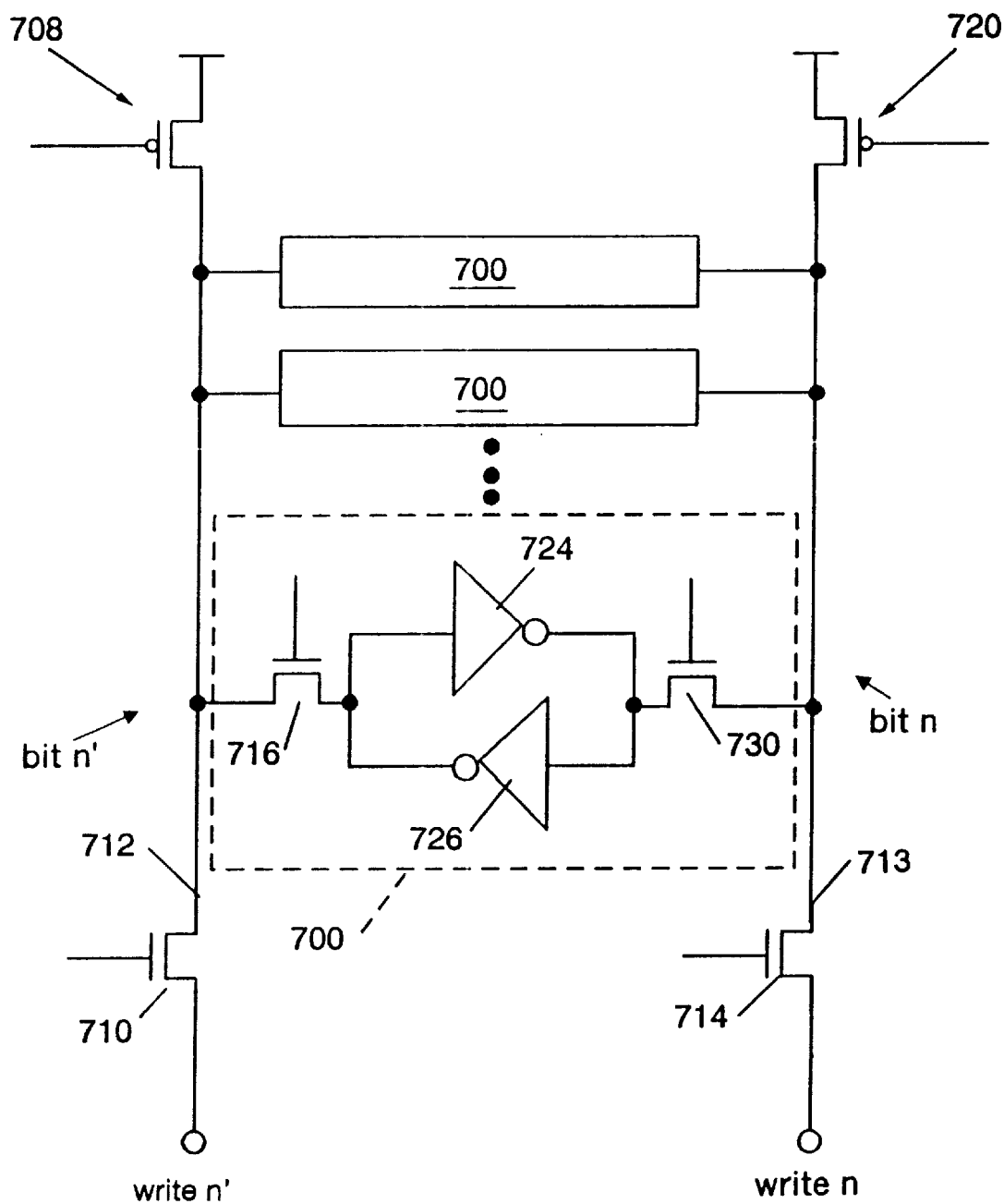
FIG. 7 illustrates a typical memory cell.

Each of the bitcells 110 within the array 504 are quite similar to the cell 700 described previously with respect to FIG. 7. Such memory cells may be accessed in a single or dual line manner. For purposes of clarity, only single wordlines for each row of bitcells 110 and single bitlines for each column within the array 504 are illustrated. However, each of the bitcells 110 could be accessed by more than one wordline and/or more than one bitline (e.g., in a differential manner).

As the dummy wordlines pass through the bitcells 110 within their respective rows, they eventually arrive at the last two columns within the array 504 (the right-most columns of bitcells 110 within the illustration of FIG. 1). The last column of bitcells 110 are accessed by dummy bitline dumbl_wrt, while the second to last column of bitcells 110 are accessed by dummy bitline dumbl_re. The bitcells 110 within these last two columns of the array 504 are also dummy bitcells, which are not used to store actual data within the array 504 for access by external circuitry. Again, these bitcells are implemented to accurately simulate the timing of the wordline and bitline signals through the array 504.

Figure 4:
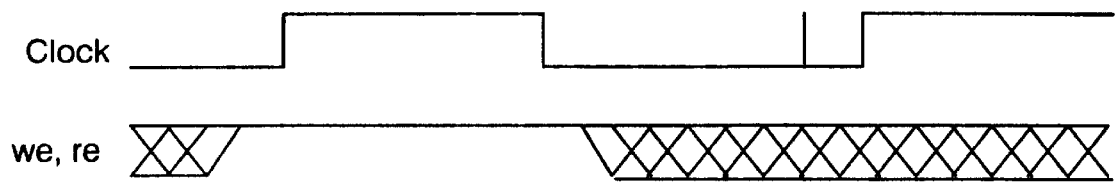
FIG. 4 illustrates timing of the we and re control signals.

The read dummy wordline dumwl_rd signal is produced by dummy wordline driver circuit 101 in response to the activation of the re, rd_enab, and wl_en signals. The write dummy wordline dumwl_wrt signal is asserted, or activated, by dummy wordline driver circuit 102 in response to the activation of the we, wrt_enab, and wl_en signals. The wl_en signal, which is also referred to herein as the wordline enable, or simply the wordline signal, is also received by all of the other wordline driver circuits 103–104. As illustrated with respect to FIG. 4, the we and re signals are control signals that are set up prior to the rising of the clock signal and are held in an active state until a short period of time after the clock signal has fallen, or become inactive. The rd_enab signal rises and falls with the clock signal, so that it is high, or active, at the same time that the clock signal is high, or active. The wrt_enab signal also tracks the clock signal so that it is active during the low phase of the clock signal for synchronous operation of the array 504. For asynchronous operation of the array 504, the wrt_enab signal is a control signal that becomes active once the sense amplifier nodes are isolated from the bitlines and then thereafter goes inactive once the dummy bitline write signal goes low. Please note that each of the columns of bitcells within the array 504 would have an associated sense amplifier (amp) associated therewith for reading the bits from the bitline along each row. However, for reasons of clarity, such sense amps are not shown, but are understood to be implemented in such an array 504.

Each of the wordline driver circuits 103–104 is used to actually store and retrieve from active bitcells 110 within the array 504. The pda and pdb signals are an intermediate form of address that is latched into the array 504. The illustration in FIG. 1 has been simplified to show only one set of pda, pdb that would be used for the read and write processes. However, there may be one set for reading, pda_rd and pdb_rd, and one set for writing pda_wrt and pdb_wrt. These signals are similar in timing to the we and re signals. If this is the case, the wordline enable circuit is broken up into a read wordline enable and write wordline enable.

Turning on and off (activation and deactivation) of the wordline enable wl_en signal is accomplished through the circuitry illustrated in FIG. 1 comprising NAND gates 105–108 and inverter 109.

Figure 2:
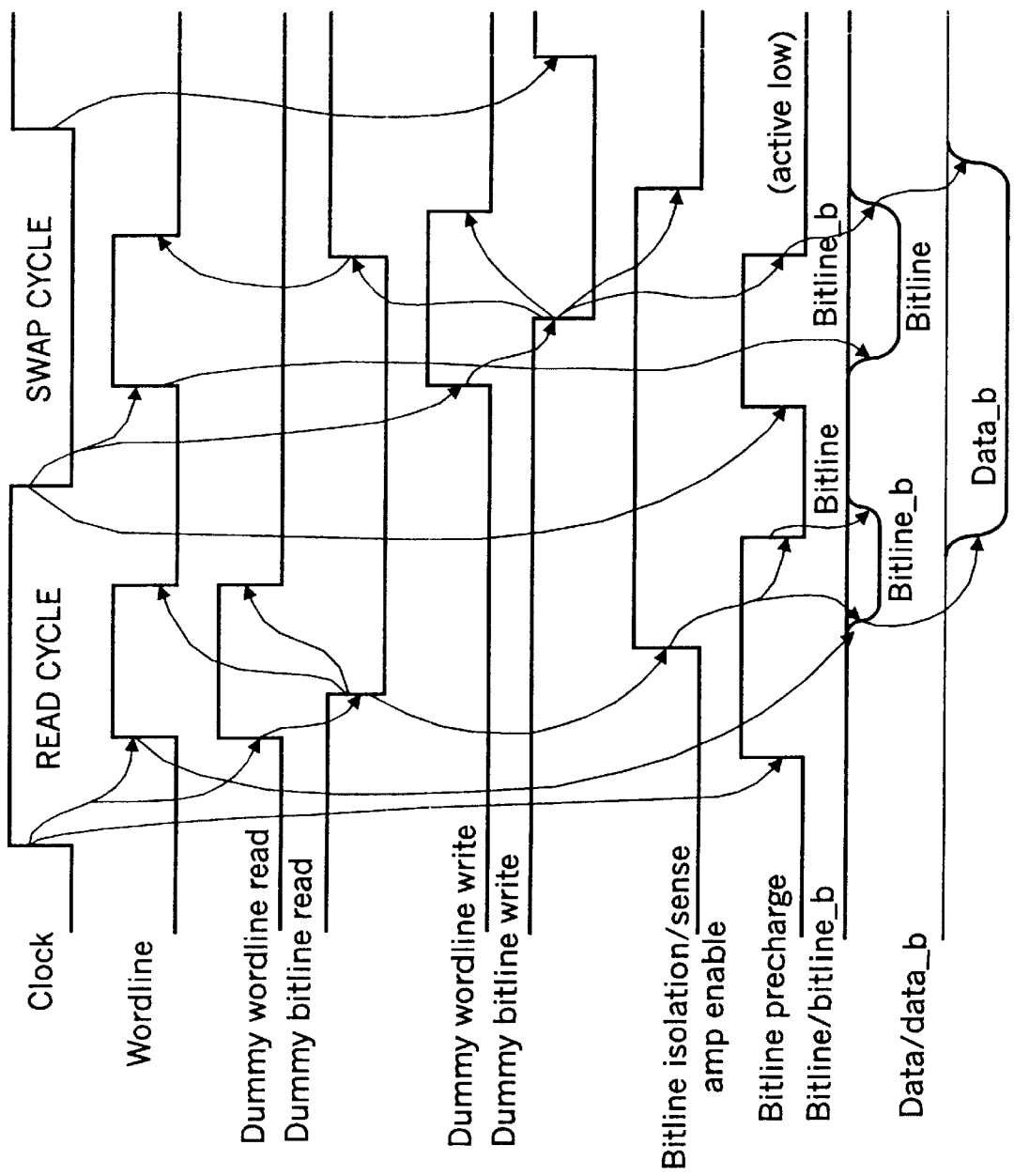
FIG. 2 illustrates a timing diagram of a synchronous read/swap cycle in accordance with the present invention.

Referring next to FIGS. 1 and 2 in combination, a read/write (read/reload-swap) cycle is illustrated in synchronous operation. As noted in FIG. 2, the read cycle occurs during the activation of the clock signal, while the swap cycle occurs during the deactivation of the clock signal. The read and reload swap (write) occur at a same location, and this is why the same wordline is active twice. The read and write do not have to be at the same location and therefore, the wordline for the reload/swap (write) can be different than the read wordline. In the second half cycle (when the clock signal goes low) the wordline pulse window is equal or less than the window in the first half cycle (read cycle).

At the beginning of the clock cycle, the bitline precharge is activated to precharge the write dummy bitline dumb_wrt. As noted previously, the re, we, and rd_enab signals are asserted when the clock cycle is asserted, while the wrt_enab signal is not asserted. Since the read and write dummy bitlines are activated (logic "1"), this will result in NAND gate 105 producing a "0" output while NAND gate 106 produces a "1" signal. This causes NAND gate 107 to produce a "1" signal, which causes NAND gate 108 to produce a "0" signal (the write dummy bitline is asserted), which results in an output from inverter 109 of a "1" signal for the wordline enable wl_en signal. This causes the dummy wordline read dumwl_rd signal to be asserted from the dummy wordline driver circuit 101. This dummy wordline read signal will pass through its respective bitcells 110. A time delay later, caused by the passage of the dummy wordline read dumwl_rd signal through its various respective bitcells 110, the dummy bitline read dumbl_re signal is discharged. The dumwl_re going high will turn on the transfer gate(s) of a plurality of dummy bitcells. These dummy bitcells are programmed to always store a "0". The dumwl_re has to be connected to at least one dummy bitcell. In the present implementation, there are 15 dummy bitcells discharging dumbl_re. The other 115 dummy bitcells have their transfer gate grounded. Since the read dummy bitline is now discharged, the output from NAND gate 105 will switch to a "1" signal causing the output of NAND gate 107 to switch to a "0" signal, causing the output of NAND gate 108 to switch to a "1" signal, turning off the wordline wl_en output from inverter 109 (kills the wordlines). The dummy wordline read dumwl_rd triggers the isolation and sense amp signals (not shown). (The dumbl_re is inverted and an active high sense amp enable is generated.) The isolation activates the bitline precharge.

In FIG. 2, when the wordline is activated, a differential voltage is developed across the bitlines and bitline_b. This differential voltage also appears at the inputs of the sense amp. In parallel, the sense amp enable and bitline isolation will be activated at appropriate times once sufficient differential voltage develops across the sense amp inputs. The active sense amp enable signals cause either data or data_b to go low in response to the plurality of the bitlines differential voltage. When the isolation signal is activated, causing bitlines to be precharged, the data or data_b will remain low until the write operation finishes.

In the second half of the cycle, the swap cycle, the wrt_enab signal is activated, while the rd_enab signal is deactivated. The output of NAND gate 105 is "1", while the output of NAND gate 106 is "0". This causes NAND gate 107 to output a "1", which in turn causes NAND gate 108 to output a "0", resulting in the output of inverter 109 of the wordline signal wl_en to be asserted. The wrt_enab signal being asserted causes the write dummy wordline dumwl_wrt signal to be activated from the dummy wordline driver circuit 102. This will eventually cause the dummy bitline write signal dumbl_wrt signal to discharge. When the write dummy bitline signal dumbl_wrt goes active low, it pulls the write enable signal down to terminate the write. This is caused by the output of NAND gate 108 to become a "1", causing the output of inverter 109 to become a "0". Additionally, the bitlines are precharged for the next read cycle. Once the dumbl_wrt goes low and as long as the clock remains low, the bitlines will stay in precharge. The dumbl_wrt triggers the isolation signal to connect bitlines to the sense amp for precharging the sense nodes. Additionally, it kills the sense amp signals. The dumbl_wrt going low causes the dumbl_re to be precharged back high, resetting the sense amp and isolation so that it is ready for the next cycle.

Figure 3:
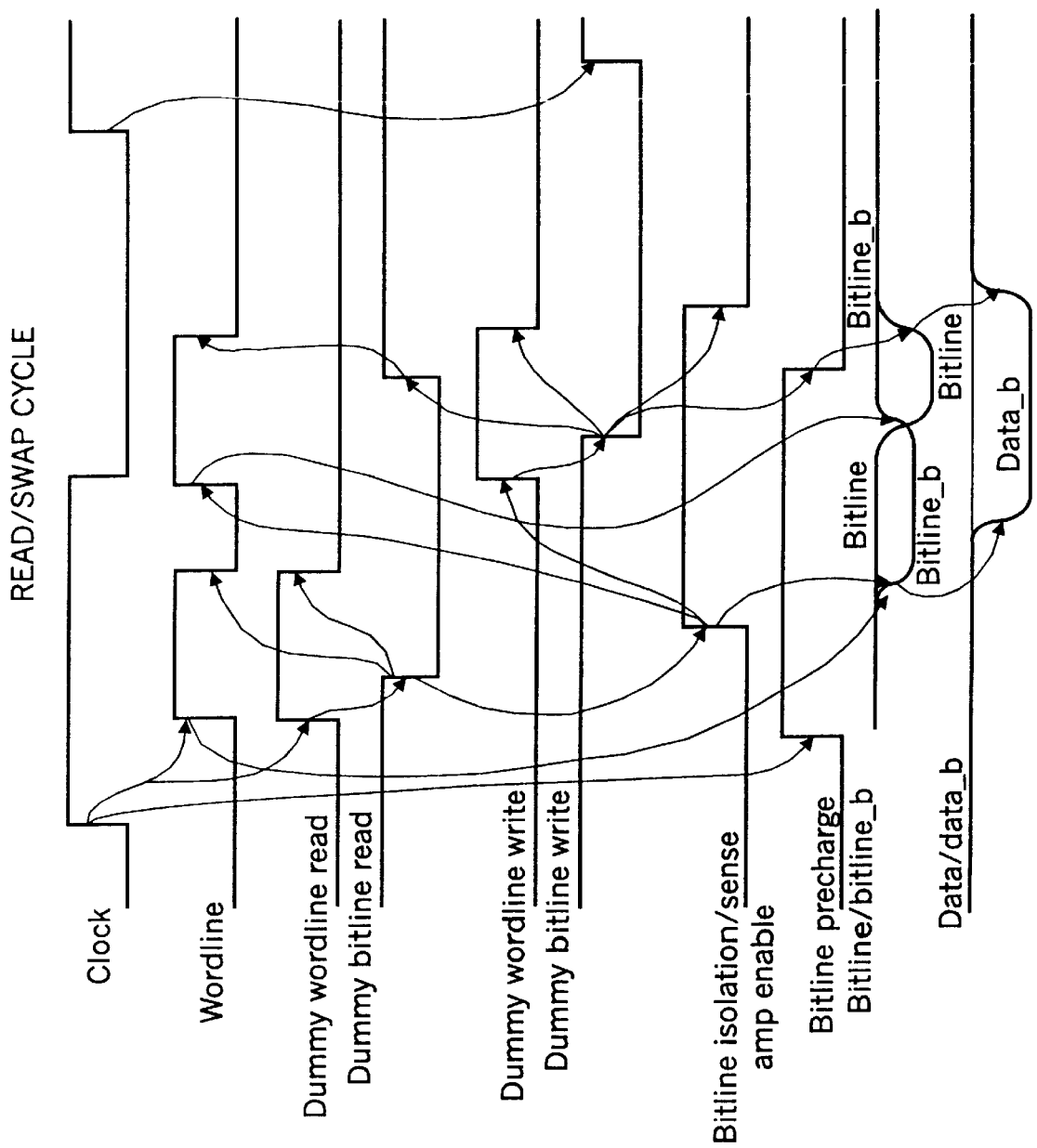
FIG. 3 illustrates a timing diagram of an asynchronous read/swap cycle in accordance with the present invention.

Referring next to FIG. 3, operation is quite similar to that as described previously with respect to the synchronous operation in FIG. 2. However, in the asynchronous operation, as soon as the bitlines are isolated from the sense amp nodes, the write can take place immediately. The wordline in the write operation is active again as soon as the bitline isolation is active. It does not have to wait for the clock edge like it does in the synchronous operation. There are two possible approaches to do an asynchronous write in the current state of the art. The first approach is described as follows: Once the read is finished, an isolation signal is activated to disconnect bitlines from the sense amp nodes. This isolation signal would trigger appropriate signals to do the write operation. However, the write has to have a same address for this approach. For the second approach, the dummy bitline needs to be precharged before the write can take place. This precharge would enable for the write to a different address. However, the precharge time would limit the operation frequency. With the second dummy bitline approach of the present invention, as soon as a bitline is isolated from the sense node, it could be used to activate the write wordline enable, which activates the write wordline. This write wordline could be derived from different addresses than the read address. The write address pulse width could be smaller than the read pulse width. This fact in conjunction with elimination of the precharge between read and write allow the memory to operate at a higher frequency. The write wordline pulse window is equal or less than the read wordline pulse window in the first half cycle. The advantage of the write dummy wordline can be easily seen in viewing FIG. 3. In a high speed SRAM, the write can be performed as soon as the read finishes. This enables the SRAM to be precharged earlier than a synchronous operation and prepared for the next cycle. This would lead naturally to a higher frequency of operation.

Figure 5:
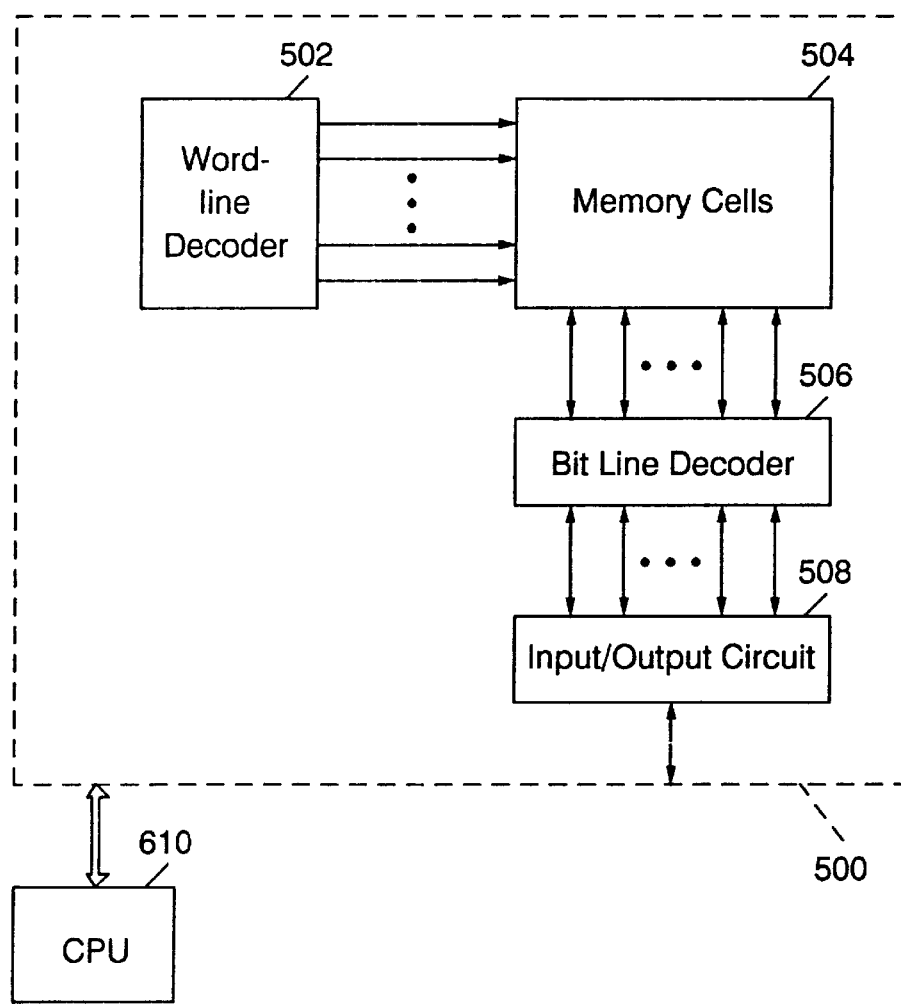
FIG. 5 illustrates a memory device configured in accordance with the present invention.

Referring next to FIG. 5, there is illustrated memory array 504, which may be implemented with memory cells 110 in accordance with the present invention. Memory cells 504 are accessed using wordline decoder 502 and bitline decoder 506 along with input/output circuit 508. Memory subsystem 500 embodying the foregoing may be a cache memory, primary or secondary, coupled to a central processing unit ("CPU") 610, or any other memory array used within a data processing system as described previously.

Figure 6:
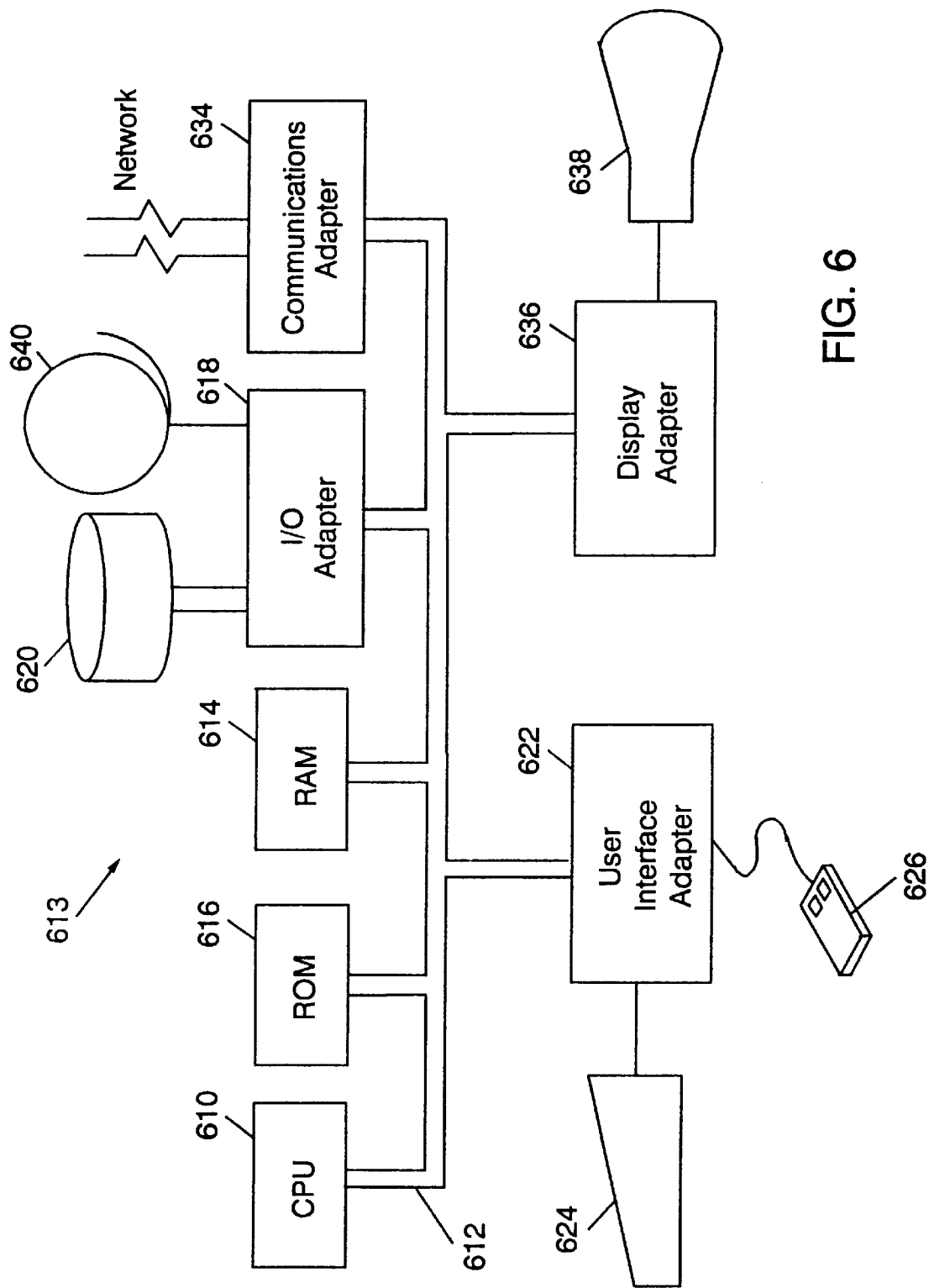
FIG. 6 illustrates a data processing system configured in accordance with the present invention.

CPU 610 may be a portion of data processing system 613 illustrated in FIG. 6. A representative hardware environment for practicing the present invention is depicted in FIG. 6, which illustrates a typical hardware configuration of workstation 613 in accordance with the subject invention having central processing unit (CPU) 610, such as a conventional microprocessor, and a number of other units interconnected via system bus 612. Workstation 613 includes random access memory (RAM) 614, read only memory (ROM) 616, and input/output (I/O) adapter 618 for connecting peripheral devices such as disk units 620 and tape drives 640 to bus 612, user interface adapter 622 for connecting keyboard 624, mouse 626, and/or other user interface devices such as a touch screen device (not shown) to bus 612, communication adapter 634 for connecting workstation 613 to a data processing network, and display adapter 636 for connecting bus 612 to display device 638. CPU 610 may include other circuitry not shown herein, which will include circuitry commonly found within a microprocessor, e.g., execution unit, bus interface unit, arithmetic logic unit, etc. CPU 610 may also reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A memory array comprising:
   a plurality of bitcells arranged in a plurality of rows and columns;
   a first dummy wordline for accessing a first one of the plurality of rows of bitcells and concurrently a first one of the plurality of columns of bitcells; and
   a second dummy wordline for accessing a second one of the plurality of rows of bitcells and concurrently a second one of the plurality of columns of bitcells.

2. The memory array as recited in claim 1, wherein the first one of the plurality of rows and the first one of the plurality of columns of bitcells and the second one of the plurality of rows and the second one of the plurality of columns of bitcells do not store writeable data for use by circuitry accessing the memory array.

3. The memory array as recited in claim 2, further comprising a third-wordline for accessing one of the plurality of rows of bitcells, wherein the third one of the plurality of rows of bitcells do store data for use by circuitry accessing the memory array.

4. The memory array as recited in claim 1, wherein the first dummy wordline is activated during a read access of a read/swap cycle, and the second dummy wordline is activated during a write access of the read/swap cycle.

5. The memory array as recited in claim 2, further comprising:
   a first dummy bitline receiving outputs of selected bitcells in the first one of the plurality of the columns of bitcells accessed by the first dummy wordline; and
   a second dummy bitline receiving outputs of selected bitcells in the second one of the plurality of the columns of bitcells accessed by the second dummy wordline.

6. The memory array as recited in claim 5, wherein the first and second dummy bitlines are used in logic operable to generate a wordline enable signal in response to the first and second dummy bitline, a read enable signal, a write enable signal and a read and a write control signal.

7. The memory array as recited in claim 5, further comprising:
   a first dummy wordline driver coupled to the first dummy wordline;
   a second dummy wordline driver coupled to the second dummy wordline;
   wherein the first dummy wordline driver is operable to generate the first dummy wordline in response to the read control signal, the read enable signal and the wordline enable signal and the second dummy wordline driver is operable to generate said second dummy wordline in response to the write control signal, the write enable signal and the wordline enable signal.

8. The memory array as recited in claim 7, wherein a read and a write for the memory array within a clock cycle are timed by the wordline enable signal received by the first and second dummy wordline drivers and circuits employed in the read and write for the memory array are controlled by the wordline enable signal, whereby the write following the read may commence asynchronous with the clock edges.

9. A data processing system comprising:
   a processor coupled by a bus to an input device, and output device, and a memory device, wherein the memory device further comprises:
   a plurality of bitcells arranged in a plurality of rows and columns;
   a first dummy wordline for accessing a first one of the plurality of rows of bitcells and concurrently a first one of the plurality of columns of bitcells; and
   a second dummy wordline for accessing a second one of the plurality of rows of bitcells and concurrently a second one of the plurality of columns of bitcells.

10. The data processing system as recited in claim 9, wherein the first one of the plurality of rows and the first one of the plurality of columns of bitcells and the second one of the plurality of rows and the second one of the plurality of columns of bitcells do not store writeable data for use by circuitry accessing the memory array.

11. The data processing system as recited in claim 10, further comprising a third wordline for accessing one of the plurality of rows of bitcells, wherein the third one of the plurality of rows of bitcells do store data for use by circuitry accessing the memory device.

12. The data processing system as recited in claim 11, wherein the first dummy wordline is activated during a read access of a read/swap cycle, and the second dummy wordline is activated during a write access of the read/swap cycle.

13. The data processing system as recited in claim 12, further comprising:
   a first dummy bitline receiving outputs of selected bitcells in the first one of the plurality of the columns of bitcells accessed by the first dummy wordline; and a second dummy bitline receiving outputs of selected bitcells in the second one of the plurality of the columns of bitcells accessed by the second dummy wordline.

14. The data processing system as recited in claim 13, further comprising:

a first dummy wordline driver coupled to the first dummy wordline;

a second dummy wordline driver coupled to the second dummy wordline;

wherein the first dummy wordline driver is operable to generate the first dummy wordline in response to the read control signal the read enable signal and the wordline enable signal and the second dummy wordline driver is operable to generate said second dummy wordline in response to the write control signal, the write enable signal and the wordline enable signal.

* * * * *